United States Patent
Willig et al.

(10) Patent No.: US 7,825,840 B2
(45) Date of Patent: Nov. 2, 2010

(54) DELTA SIGMA MODULATOR

(75) Inventors: Rainer Willig, Tamm (DE); Burkhard Kuhlmann, Reutlingen (DE); Udo-Martin Gomez, Leonberg (DE); Wolfram Bauer, Tuebingen (DE); Reinhard Neul, Stuttgart (DE); Christoph Lang, Palo Alto, CA (US); Michael Veith, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 159 days.

(21) Appl. No.: 11/883,093

(22) PCT Filed: Dec. 13, 2005

(86) PCT No.: PCT/EP2005/056743

§ 371 (c)(1),
(2), (4) Date: Apr. 4, 2008

(87) PCT Pub. No.: WO2006/079435

PCT Pub. Date: Aug. 3, 2006

(65) Prior Publication Data

US 2008/0284628 A1    Nov. 20, 2008

(30) Foreign Application Priority Data

Jan. 26, 2005    (DE) .................... 10 2005 003 630

(51) Int. Cl.
*H03M 3/00*    (2006.01)

(52) U.S. Cl. ..................................... 341/143

(58) Field of Classification Search ................... 341/143
See application file for complete search history.

(56) References Cited

U.S. PATENT DOCUMENTS

| | | | | |
|---|---|---|---|---|
| 5,459,432 | A | * | 10/1995 | White et al. ................. 329/307 |
| 6,232,899 | B1 | | 5/2001 | Craven |
| 2004/0041665 | A1 | | 3/2004 | Hode et al. |
| 2004/0169437 | A1 | * | 9/2004 | Orsier et al. ................. 310/322 |
| 2006/0033588 | A1 | * | 2/2006 | Caminada et al. ........... 331/154 |
| 2008/0197943 | A1 | * | 8/2008 | Xu et al. ..................... 333/194 |

FOREIGN PATENT DOCUMENTS

| | | |
|---|---|---|
| GB | 2378831 | 2/2003 |
| JP | 05327511 A * | 12/1993 |
| WO | WO 2007011307 A1 * | 1/2007 |

OTHER PUBLICATIONS

Jiangfeng Wu et al.: "A Simulation Study of Electromechanical Delta-Sigma Modulators" ISCAS 2001, Proceedings of the 2001 IEEE International Symposium on Circuits and systems, Sydney, Australia, May 6-9, 2001, Bd. vol. 1 of 5, Seiten 453-456, XP010541174.

Wu J und Carley L.R.: A Table-Based Time-Domain Simulation Method for Oversampled Microelectromechanical Systems In: Proceedings of IEEE/ACM International Workshop on Behavioral Modeling and Simulation, 19.020.10.2000, Orlando, FL, USA, S. 37-41.

* cited by examiner

*Primary Examiner*—Howard Williams
(74) *Attorney, Agent, or Firm*—Kenyon & Kenyon LLP

(57) ABSTRACT

A delta sigma modulator includes an oscillatory system having a natural frequency and an electronics and a control loop which acts upon the electronics from the oscillatory system and again upon the oscillatory system from the electronics. The control loop provides that a gain in the control loop demonstrates a peaking in a frequency range around the natural frequency of the oscillatory system.

8 Claims, 6 Drawing Sheets

DELTA SIGMA MODULATOR

FIELD OF THE INVENTION

The present invention is directed to a delta sigma modulator which includes an oscillatory system having a natural frequency as well as electronics and a control loop which acts upon the electronics from the oscillatory system and again upon the oscillatory system from the electronics.

BACKGROUND INFORMATION

Microsystems in which micromechanical sensors having evaluation electronics are combined are key components of modern systems in motor vehicles, for example the electronic stability program (ESP), airbag control, rollover sensing and navigation. One highly advantageous way to combine the micromechanical sensor element with microelectronic evaluation electronics is to construct an electromechanical delta sigma modulator.

Electromechanical delta sigma modulators according to the related art are discussed in "Surface Micromachined Accelerometers," Bernhard E. Baser, Roger T. Howe, IEEE Journal of Solid State Circuits, Vol. 31, No. 3, March 1996, and C. Lang "Modellbildung und Realisierung eines rauscharmen elektromechanischen $\Delta\Sigma$-Modulators zur Beschleunigungsmessung nach dem Prinzip der Kraftkompensation" (Modeling and Implementation of a Low-Noise Electromechanical Delta Sigma Modulator for Measuring Acceleration According to the Force Compensation Principle), Shaker-Verlag, Aachen, 2001, ISBN 3-8265-8616-6.

SUMMARY OF THE INVENTION

The exemplary embodiment and/or exemplary method of the present invention is directed to a delta sigma modulator which includes an oscillatory system having a natural frequency as well as electronics and a control loop which acts upon the electronics from the oscillatory system and again upon the oscillatory system from the electronics. An object of the exemplary embodiment and/or exemplary method of the present invention is to design the control loop in such a way that a gain in the control loop demonstrates a peaking in a frequency range around the natural frequency of the oscillatory system. The quantization noise of the electronics may advantageously be shaped as a function of the frequency of the signal in the control loop.

According to one advantageous embodiment of the present invention, the oscillatory system has a mechanical design. In a system of this type, the functions of a transducer, in particular for accelerations or yaw rates, are advantageously combinable with the functions of a module in a delta sigma modulator, namely an integrator for shaping the quantization noise. In the electromechanical delta sigma modulator, the integrating behavior of the mechanics is advantageously utilized to shape the quantization noise of the ADC and DAC. The mechanics respond to a (Coriolis) acceleration by the deflection of a moving mass. The transmission function from acceleration to deflection involves two integrators. One integrator describes the conversion of acceleration to the velocity of the moving mass. The second integrator describes the conversion of velocity to deflection. In contrast, exclusively electronic delta sigma modulators use exclusively electronic integrators (usually switched capacitor circuits) to shape the quantization noise of the DAC.

It is advantageous that the delta sigma modulator has a bandpass characteristic at one output. The delta sigma modulator according to the exemplary embodiment and/or exemplary method of the present invention, having a bandpass characteristic, is advantageously suitable for processing signals having a certain or known bandwidth, for example a carrier frequency having modulated signals.

It is advantageous that the electronics include an analog-digital converter (ADC), a digital-analog converter (DAC) and a gain setting arrangement for setting the gain in the control loop and/or the bandwidth of the delta sigma modulator independently of an input signal of the analog-digital converter (ADC).

According to one advantageous embodiment of the delta sigma modulator according to the present invention, the electronics include a multibit analog-digital converter and/or a multibit digital-analog converter. This makes it possible to advantageously set a defined gain at the analog-digital converter which is independent of the input signal of the analog-digital converter. The quantization error of the analog-digital converter may also be advantageously minimized. The same advantages also apply to the digital-analog converter.

According to a further advantageous embodiment of the delta sigma modulator according to the present invention, the electronics include a low pass filter having a figure of merit peak, in particular a digital filter, so that the electromechanical delta sigma modulator has a bandpass characteristic having a midband frequency at the natural frequency of the oscillatory system. This enables the bandwidth to be advantageously set independently of the input signal. The following and other equivalent circuits are also advantageous.

According to a further advantageous embodiment of the delta sigma modulator according to the present invention, the electronics include a bandpass filter, in particular a digital filter, and a phase shifter, so that the delta sigma modulator has a bandpass characteristic having a midband frequency at the natural frequency of the oscillatory system. This also enables the bandwidth to be advantageously set independently of the input signal. In particular, a digital design of the two aforementioned filters is advantageous.

According to a further advantageous embodiment, the electronics include a deriving arrangement for deriving an oscillation frequency of the oscillatory system, in particular a phase locked loop, via which the midband frequency is controlled. For example, this embodiment advantageously renders the phase shift of the low pass having a figure of merit peak at the drive resonance frequency independent of tolerances in the manufacturing process. This ensures the stability of the delta sigma modulator.

According to a particularly advantageous embodiment of the delta sigma modulator according to the exemplary embodiment and/or exemplary method of the present invention, the digital-analog converter has a centered pulse width-modulated output signal which acts upon the oscillatory system, in particular for the purpose of feedback. A constant size (amplitude) of the feedback signal (feedback voltage) is advantageous. A quantization and linearization of the feedback signal (feedback force) of the delta sigma modulator in the time domain is also advantageous. Finally, it is also advantageous to center the feedback voltage pulse in such a way that the time center of the pulse always lies in the same clock phase. This avoids phase shifts of the oscillation of the oscillatory system as a result of different feedback signals.

Exemplary embodiments of the present invention are illustrated in the drawings and explained in greater detail in the following description.

Other advantageous embodiments are described herein.

DETAILED DESCRIPTION

The exemplary embodiment and/or exemplary method of the present invention is explained in detail on the basis of the embodiments described below.

Figure 1:
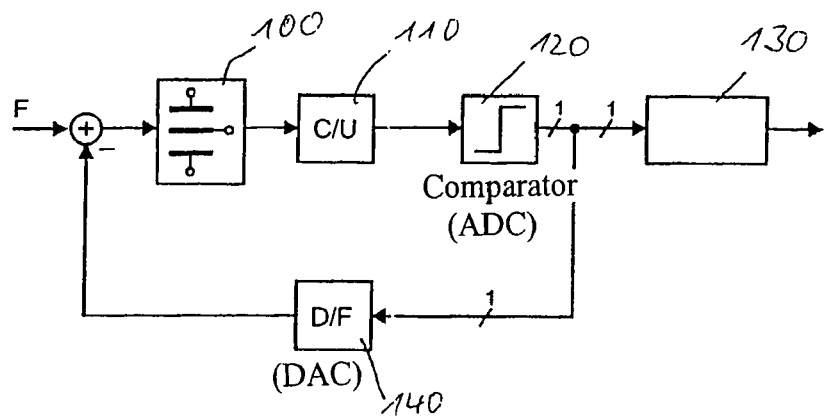
FIG. 1 shows the layout of an electromechanical delta sigma modulator according to the related art.
Figure 2:
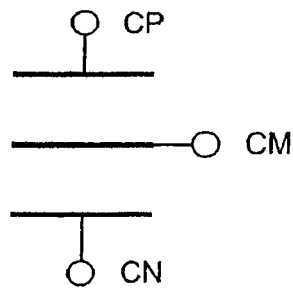
FIG. 2 shows a mechanical sensor element as a differential capacitor.

FIG. 1 shows the layout of an electromechanical delta sigma modulator according to the related art. Before discussing the characteristics, the mode of operation is described below. FIG. 1 shows a block diagram of a microsystem of this type. A force F acts upon a mechanical oscillator 100, in the present example a sensor element. This force F may be, for example, the quantity to be measured in an acceleration sensor or the Coriolis force in a yaw rate sensor. This force results in a change in capacitance of sensor element 100 which is converted to an analog voltage by a capacitance-voltage converter (C/U converter) 110. This analog voltage is compared with a single threshold by a clocked comparator 120 (1-bit analog-digital converter, ADC) as the input signal and is thus converted to digital. A digital-analog converter 140 (D/F, DAC) running at the same clock frequency generates an impulse as a function of the output signal of comparator 120. DAC 140 is able to generate two possible impulses. Both impulses have the same absolute value. Only their signs are different. FIG. 2 illustrates this process. A digital output signal of the delta sigma modulator is supplied to a digital output circuit 130. Reference numeral 1 indicates that all signals in the digital part of the delta sigma modulator have the same bit width.

FIG. 2 shows a mechanical oscillator in the form of a mechanical sensor element 100 as the differential capacitor. A central electrode CM between two outer electrodes CP and CN is illustrated. Central electrode CM is movable. Outer electrodes CP and CN are stationary. If a positive impulse is applied, a constant voltage is provided between CP and CM during a preset period of time. CM and CN are short-circuited. The electrostatic force resulting herefrom pulls the central electrode in the direction of CP. If a negative impulse is applied, the same voltage is provided between electrodes CM and CN for the same period of time. Electrodes CP and CM are short-circuited. The resulting impulse pulls the central electrode in the direction of CN. On average, a sequence of impulses compensates force F to be measured, and movable electrode CM is maintained in the central home position.

The main characteristics of this method are described below:

If sensor element 100 were not guided by the electronics, using the impulses induced by DAC 140 via the electrodes, and were not thereby more or less fixed in place, but if it could instead move freely, a deflection-dependent mechanical spring constant of this oscillator would become apparent throughout the measuring system as nonlinearity. Guiding sensor element 100 in the electromechanical delta sigma modulator therefore prevents deflection of the center mass of the mechanical oscillator and thus eliminates the danger of nonlinearity due to sensor element 100. The mechanical properties of sensor element 100 are therefore linearized.

Figure 3:
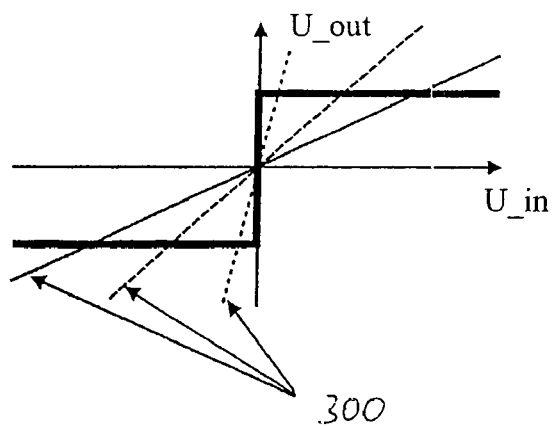
FIG. 3 shows the comparator characteristic curve of an analog-digital converter.

Because the average effective restoring force includes individual impulse quanta, all of which have the same absolute value, and only two possible feedback impulses exist, the characteristic curve of digital-analog converter DAC is always ideally linear. A straight line may always be drawn through two points. The restoring force is therefore also linearized. FIG. 3 illustrates this on the basis of the comparator characteristic curve.

FIG. 3 shows the comparator characteristic curve of an analog-digital converter. Input voltage U_in of analog-digital converter ADC is compared with a single threshold, and output voltage U_out of the analog-digital converter may assume only two values. If U_out is positive, a positive impulse is fed back and vice-versa. However, the system described has the disadvantage that the slope of the straight line is not defined in FIG. 3. To indicate this, three straight lines 300 having different slopes are drawn in FIG. 3. Which of these three straight lines 300 truly describes the gain of analog-digital converter ADC depends on the statistical distribution of voltage U_in. The gain of the series connection of analog-digital converter ADC and digital-analog converter DAC is therefore not defined, but rather depends on the input signal of analog-digital converter ADC, as described in the publication entitled "Surface Micromachined Accelerometers," Bernhard E. Boser, Roger T. Howe, IEEE Journal of Solid State Circuits, Vol. 31, No. 3, March 1996. This results in the disadvantage of a loop gain (gain in the control loop) in the delta sigma modulator which is dependent on the input signal and therefore may not be set in a defined manner. Since the bandwidth of the delta sigma modulator is a function of the loop gain, this may not be set either, and it is dependent on the signal. The bandwidth of the delta sigma modulator may be several magnitudes higher than the bandwidth to be detected by the measuring system. This may result in a serious problem if the micromechanical sensor element has spurious resonance frequencies in a frequency range which is also encompassed by the variable bandwidth of the delta sigma modulator. This may result in a signal-dependent instability of the delta sigma modulator which renders the product unusable.

Figure 4:
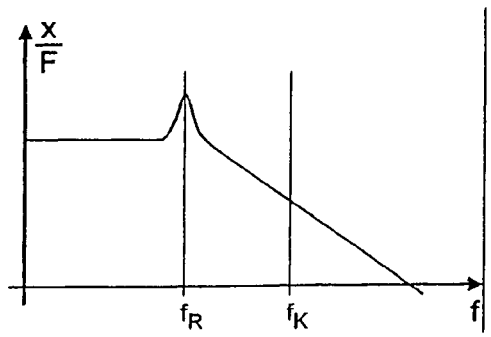
FIG. 4 shows the analog-digital transmission function of a typical oscillatory sensor element having a figure of merit peak.

FIG. 4 shows the analog-digital transmission function of a typical mechanical oscillator having a figure of merit peak. Analog-digital converter ADC quantizes the analog input signal into two possible digital values. This digital value determines the polarity of the fed-back impulse. Impulses are then applied to the sensor element at a relatively high frequency, and the sensor element responds to the impulses according to a second-order integrator. FIG. 4 shows the transmission function (deflection x as the response to a force F) of a typical sensor element: having a figure of merit peak above frequency f. The impulses are applied to the sensor element at a frequency $f_K$ which lies above sensor resonance frequency $f_R$ of the natural frequency of the oscillatory system. In this frequency range, the characteristic curves falls at 40 dB per decade. The deflection of the center mass of the sensor element represents the low pass-filtered response to a sequence of impulses. The present quantization error of analog-digital converter ADC is ultimately also integrated in the sensor element and, in turn, influences the future decisions of analog-digital converter ADC. Over a prolonged period of time, the quantization errors are therefore filtered by the sensor element. The quantization noise is shaped. At the system output, the quantization noise is the lowest in the frequency range in which the sensor element has the greatest gain.

The higher the clock frequency, the broader the frequency band to which the quantization noise output is distributed. Consequently, in the case of a constant quantization noise output, the noise output density in the system bandwidth decreases as the clock frequency increases.

One way to achieve a high signal-to-noise ratio is to increase the clock frequency. However, this option is limited if the input circuit is no longer able to undergo transient oscillation in the preset time slots.

Another way to increase the signal-to-noise ratio is to increase the order of the delta sigma modulator. This means using frequency-selective circuits to ensure that the loop gain is maximized in the range of the system bandwidth, and the loop gain outside the system bandwidth decreases as steeply as possible. However, this procedure comes with a substantial risk in that the system may become unstable, particularly if the system bandwidth is difficult to dimension, due to a 1-bit analog-digital converter, and any non-ideal states of the sensor element result in spurious resonances in the sensor element which have a negative effect on the loop gain.

Because the delta sigma modulator operates as a closed control loop which continuously returns the movable electrode of the sensor element to its home position, sensor elements are operable as oscillatory systems of high mechanical quality. This enables a high signal-to-noise ratio to be achieved.

The implicit A/D conversion of the delta sigma principle has the advantage that the output signal of the delta sigma modulator may be further processed in a directly digital manner. This digital further processability provides the advantages, among other things, that the design is extremely resistant to electromagnetic interference, no long-time drift or temperature dependencies are of concern, very few external components are needed and extremely high time constants are achievable.

Figure 5:
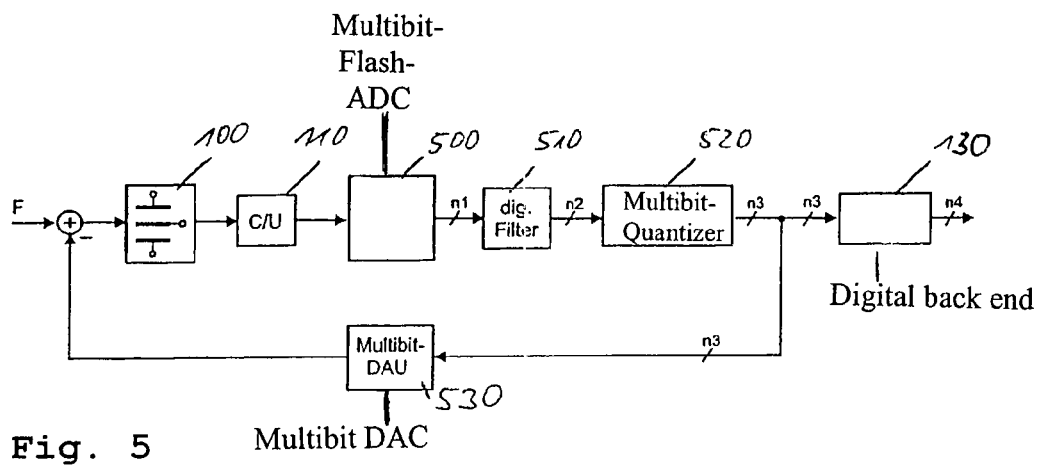
FIG. 5 shows the layout of an electromechanical delta sigma modulator having multibit converters.

An improvement over the state of the art described up to now is provided in the publication by C. Lang entitled "Modellbildung und Realisierung eines rauscharmen elektromechanischen ΔΣ-Modulators zur Beschleunigungsmessung nach dem Prinzip der Kraftkompensation" (Modeling and Implementation of a Low-Noise Electromagnetic Delta Sigma Modulator for Measuring Acceleration According to the Force Compensation Principle), Shaker-Verlag, Aachen, 2001, ISBN 3-8265-8616-6, based on the example of an acceleration sensor. The points made in the publication by C. Lang which are important to an understanding and assessment of the ideas described in the context of the exemplary embodiment and/or exemplary method of the present invention are illustrated below. FIG. 5 describes the most important points.

FIG. 5 shows the layout of an electromechanical delta sigma modulator having multibit converters. The schematic diagram shows an electromagnetic delta sigma modulator which is enhanced over the representation in FIG. 1. A flash multibit ADC 500 is proposed here instead of a comparator (1-bit ADC) 120. The advantage of the flash multibit ADC 500 is that the quantization error of the A/D conversion may be minimized in comparison to 1-bit ADC 120, resulting in less quantization noise.

It is further proposed according to the related art to use a filter 510, in particular a digital low pass filter after multibit ADC 500. This provides the advantages that the quantization noise of digital-analog converter DAC is substantially shaped at low frequencies, which enables the signal-to-noise ratio to be increased at low bandwidths. A further advantage is that the filter power consumption is very low, and the filter is extremely resistant to temperature fluctuations and electromagnetic interference.

It is further proposed according to the related art to use a multibit DAC 530, as shown in FIG. 5. This converter provides the advantage that the quantization error is reduced, compared to the 1-bit converter, which enables the sensor noise to be substantially reduced. This is achieved without sacrificing linearity.

The exemplary embodiment and/or exemplary method of the present invention differs from the related art in that the bandwidth of the delta sigma modulator is dimensioned so that it is no larger than necessary. This provides the advantage that the frequency band in which spurious resonant frequencies of the sensor element may be active is minimized to the greatest possible extent. This increases the resistance to spurious modes and their scatter in the sensor element as well as to production tolerances in the electronics. In contrast to the low pass characteristic of the electromagnetic delta sigma modulator described as the related art, this means that the loop gain of the delta sigma modulator may be selectively set as low as possible in the frequency range from zero to the drive resonance frequency of the sensor element. The electromechanical delta sigma modulator obtains a bandpass characteristic as a result.

Figure 10:
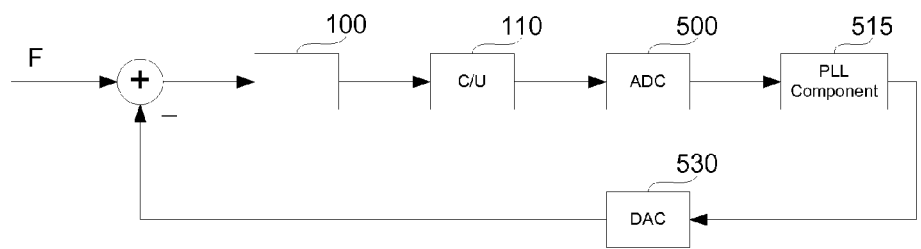
FIG. 10 shows the layout of an electromechanical delta sigma modulator including a phase locked loop component.

In an example embodiment according to the present invention, shown schematically in FIG. 10, the electronics are designed to include a phase locked loop component 515 via which the midband frequency is controlled.

Figure 11:
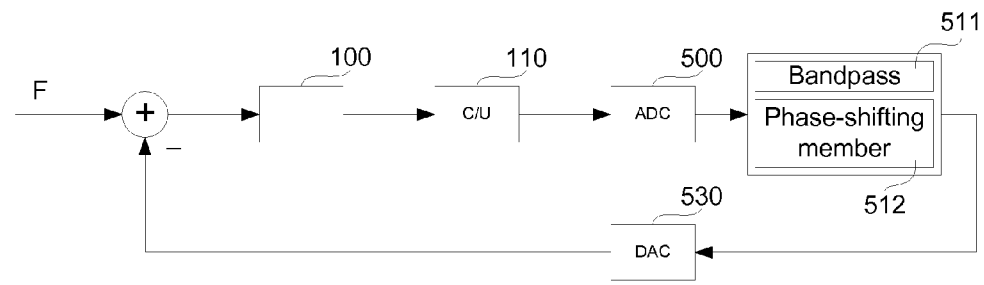
FIG. 11 shows the layout of an electromechanical delta sigma modulator including a bandpass and phase-shifting member.

In a first embodiment according to the present invention, the electronics are designed as a low pass having a figure of merit peak at the drive resonance frequency. This produces a particularly pronounced shaping of the quantization noise of digital-analog converter DAC in the range of the drive resonance frequency. In a second embodiment according to the present invention, e.g., as shown schematically in FIG. 11, a combination of a bandpass 511, which has the center frequency at the drive resonance frequency, and a phase-shifting member 512 may be used instead of a low pass having a resonance peak. Regulator types which have a particularly high gain at the drive resonance frequency may also be generally used in this case.

Since a delta sigma modulator which includes a 1-bit converter has a signal-dependent loop gain and therefore a signal-dependent bandwidth, a converter of this type is not suitable for minimizing the bandwidth according to the exemplary embodiment and/or exemplary method of the present invention. The use of a multibit ADC defines the converter gain, which is therefore independent of the converter input signal. The same applies to the use of the multibit DAC.

Figure 6:
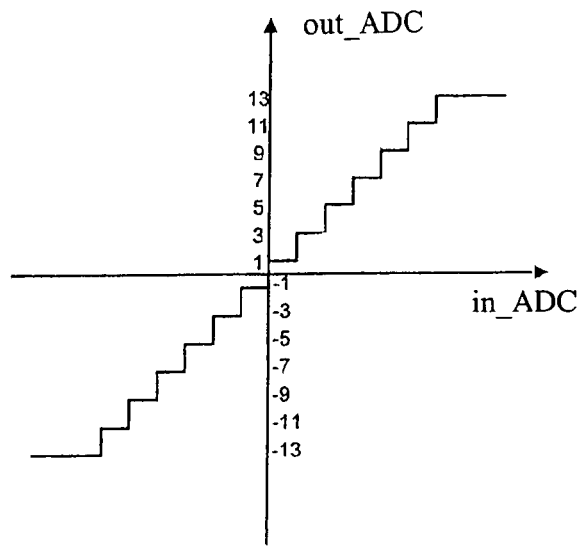
FIG. 6 shows the characteristic curve of a multibit ADC.
Figure 7:
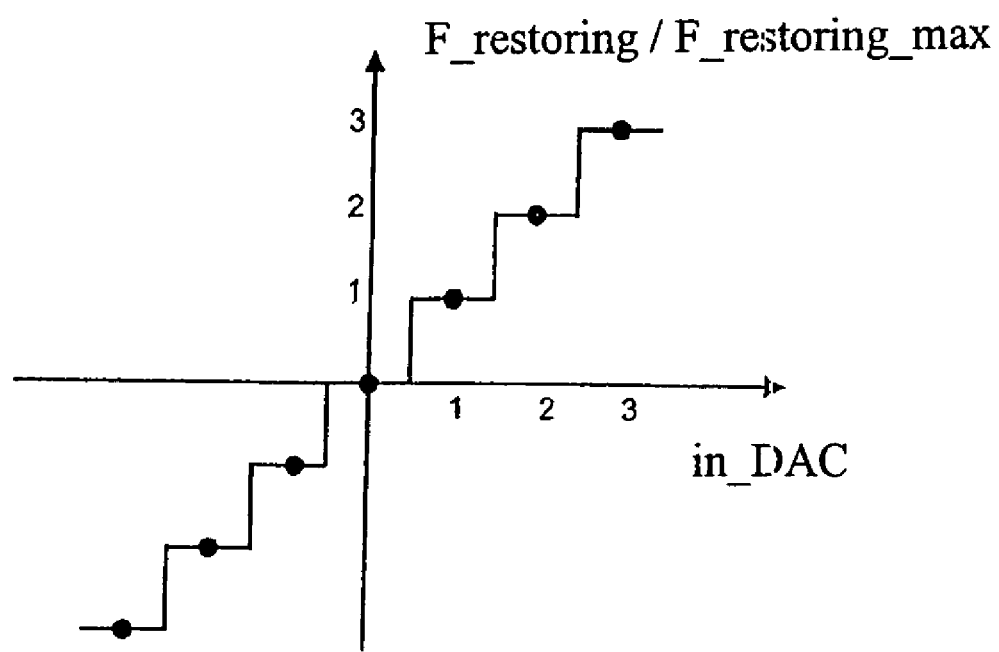
FIG. 7 shows the characteristic curve of a multibit DAC.

FIG. 6 shows the characteristic curve of a multibit ADC, and FIG. 7 shows the characteristic curve of a multibit DAC. The figures show that the converters have a defined gain. One can draw only one straight line through each of the two converter characteristic curves to describe the gain. This distinguishes the multibit converters from the 1-bit converter (comparator) in which different straight lines having different gains may be drawn through the characteristic curve. A further advantage of the multibit converters is that the deviation from the straight line, which describes the gain, is much smaller than in the case of the 1-bit converter. The deviation from this straight line is also referred to as the quantization error. A smaller quantization error means less quantization noise. The characteristic curves of the converters are illustrated as examples in FIGS. 6 and 7.

The multibit flash analog-digital converter is advantageously implemented as described in the publication by C. Lang.

In the case of the multibit digital-analog converter (multibit DAC), the requirements to be met by the DAC according to the exemplary embodiment and/or exemplary method of the present invention are first addressed below, followed by an embodiment of the DAC according to the present invention.

The function of the multibit DAC is to provide a feedback signal which is used to compensate the Coriolis force to be measured. The exemplary embodiment and/or exemplary method of the present invention relates to the fact that this restoring force is generated by the electrostatics in the sensor element, and the function of the electronics is to apply appropriate voltages to the sensor element. The problem thus arises that the correlation between the voltage and the resulting force is quadratic. A linearization must therefore take place.

A further object of the exemplary embodiment and/or exemplary method of the present invention is the selective use of a multibit DAC to assign a defined gain to the converter, thus making it possible to set the loop gain and bandwidth of the delta sigma modulator in a defined manner and therefore become independent of the input signal of the delta sigma modulator with regard to loop gain and bandwidth.

The requirements of linearization and multibit conversion may be met by the use according to the exemplary embodiment and/or exemplary method of the present invention of a centered pulse-width modulated signal (centered PWM signal or CPWM signal), as described below.

Figure 9:
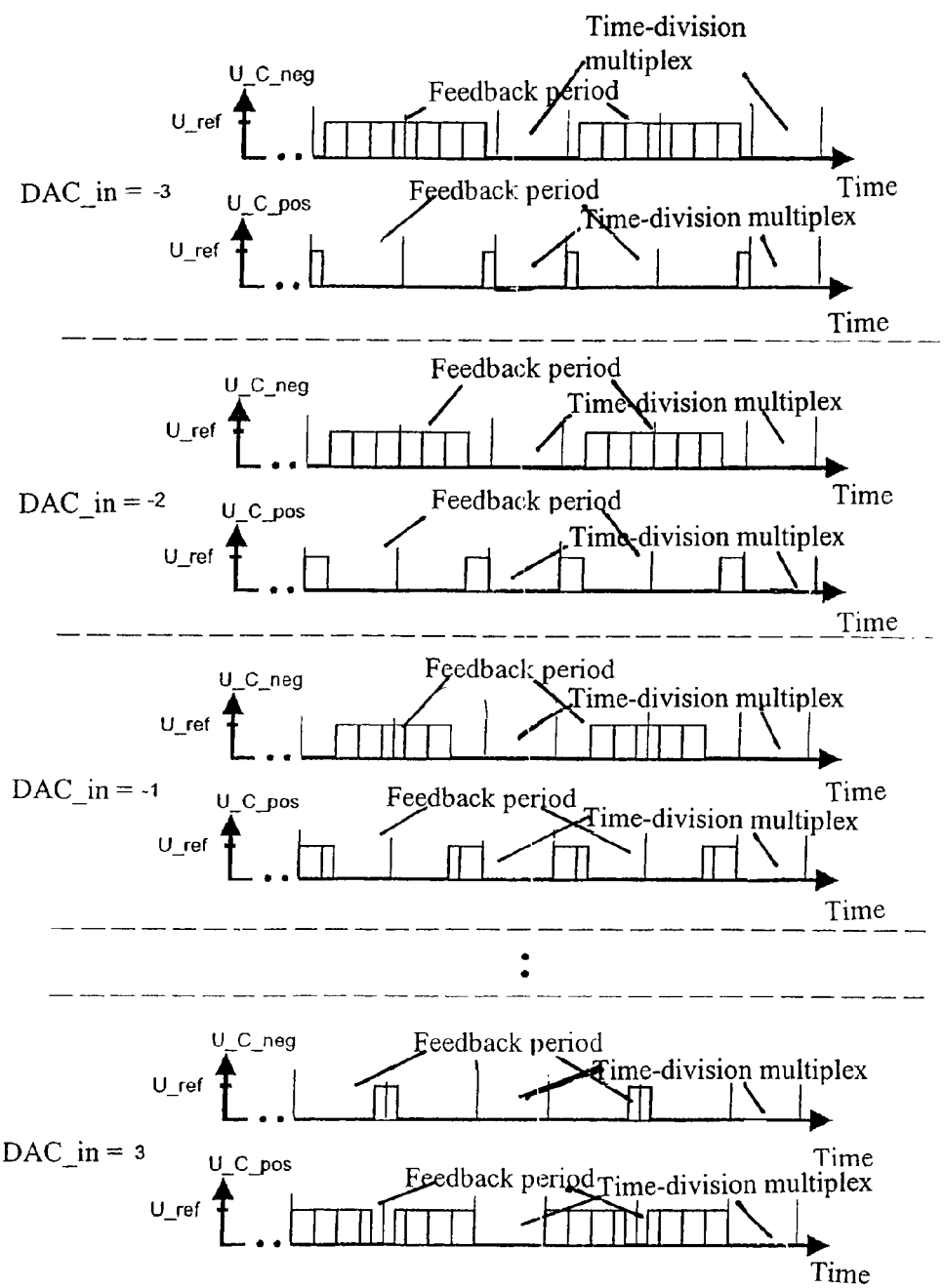
FIG. 9 shows the CPWM signal of the multibit DAC, by way of example, in one embodiment of the delta sigma modulator according to the exemplary embodiment and/or exemplary method of the present invention.

FIG. 9 shows the assignment between the drive bits and the possible feedback signals. The level of the feedback voltage is constant; both the quantization and the linearization take place in the time domain. In FIG. 9, the feedback signal of the delta sigma modulator is plotted over time. The upper subfigure applies in the event that the DAC input assumes a value of DAC_in=3. The top timeline describes voltage U_C_neg at electrode CN. The second timeline from the top describes voltage U_C_pos at electrode CP. In the time segment identified as "feedback period," the aforementioned signals are in opposition. While reference voltage U_ref is present at one of the two electrodes, the other electrode is short-circuited by the center mass. The time integral over the voltage present during the feedback period determines the effective restoring force. There is no feedback in the time segment described as "time-division multiplex." This time segment may be used for other purposes, for example to measure deflection.

The figures for DAC_in=−2, DAC_in=−1 and DAC_in=3 show the curves for the feedback voltages for other DAC input signals. Voltage curves U_C_neg and U_C_pos present during the feedback period are distinguished from each other by signal DAC_in over the length of the period for which voltage U_ref is applied to the sensor element. This time period is quantized in the time domain.

The DAC input signal is updated periodically. As a result, voltages U_C_neg and U_C_pos applied to the sensor element for feedback purposes are also embedded in a periodic pattern. This pattern always includes a "feedback period" of constant duration and a "time-division multiplex period" of constant duration. Only the distribution of the voltage pulses to the two feedback electrodes is varied as a function of signal DAC_in during the feedback period.

A further property of the feedback PWM signal according to the exemplary embodiment and/or exemplary method of the present invention is the fact that it is centered. Regardless of the width of a feedback pulse, the time center of the pulse is always in the same clock phase. This renders the time center of the feedback pulse independent of the signal, so that signal-dependent corruption of the feedback signal is not possible. This prevents the output signal of the delta sigma modulator from becoming nonlinear.

A further advantage of the procedure described above is that regularly recurring time slots may be kept available and used to implement functions during time-division multiplexing which are independent of the feedback function.

Another difference from the multibit digital-analog conversion described in the publication by C. Lang is that, instead of generating a single pulse for each LSB of the DA conversion control (return to zero), the LSBs in the CPWM signal are simply appended to each other (non-return to zero). This provides the advantage that the maximum feedback force is greater in the case of the CPWM signal than in the implementation described in the publication by C. Lang. The reason is that no feedback time is lost by returns to zero.

A further object of the exemplary embodiment and/or exemplary method of the present invention is the use of a low pass filter having a figure of merit peak in the electromechanical delta sigma modulator. A combination of a bandpass and phase shifter may also be used instead of this low pass.

A type of regulator which demonstrates peaking in the range of the drive resonance frequency may generally be used. In combination with the bandpass characteristic of the mechanical sensor element, the bandpass characteristic of the filter provides the advantage that the frequency range in which the loop gain of the delta sigma modulator is greater than one is limited to a frequency range which is centered around the sensor resonance frequency and which may be selected as narrowly as possible to increase the resistance to spurious resonance modes. A pronounced shaping of the DAC quantization noise also takes place. The quantization noise of the ADC is produced by the mechanics. These processes are illustrated in FIG. 8.

Figure 8:
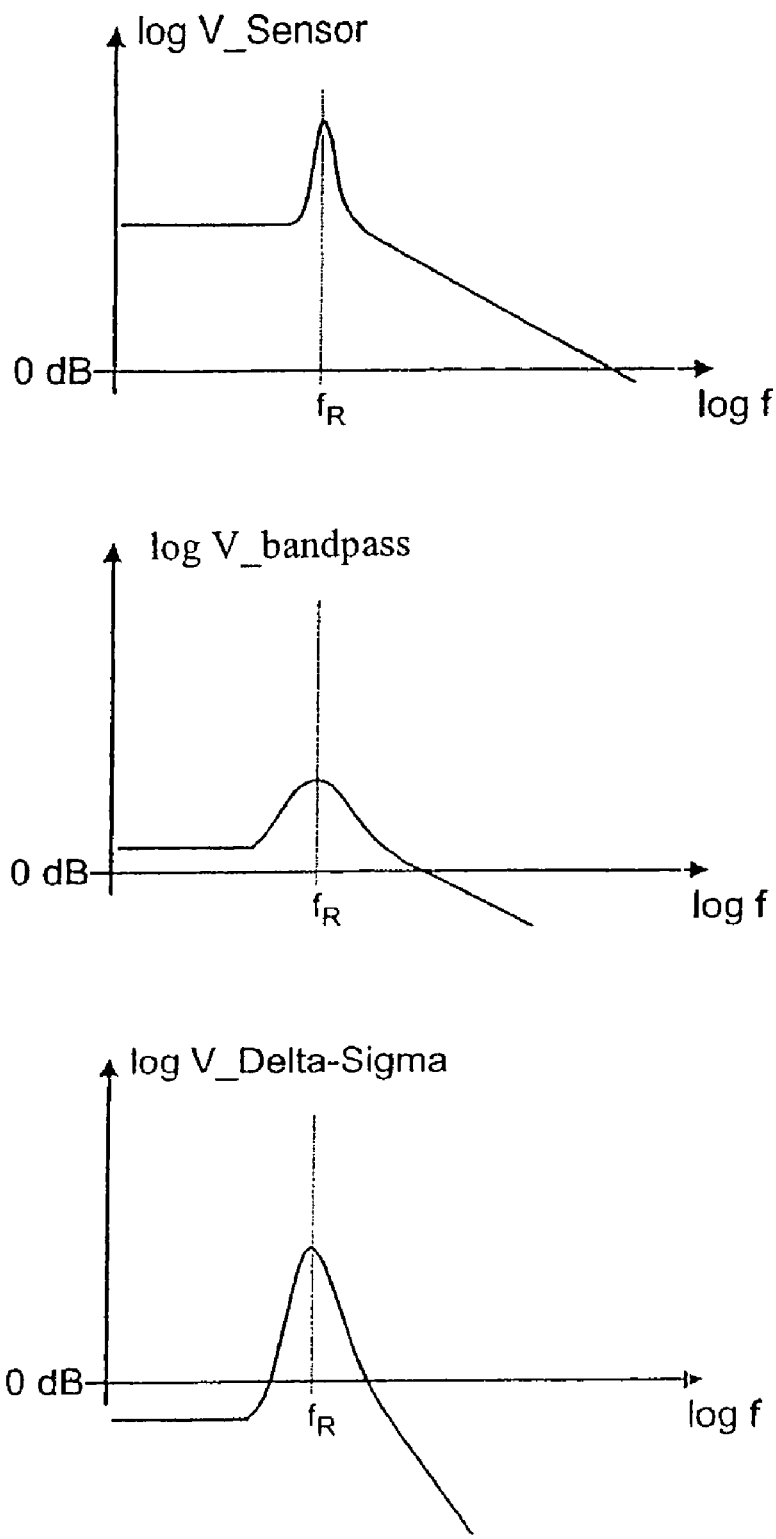
FIG. 8 shows the gain frequency responses in the control loop of one embodiment of the delta sigma modulator according to the exemplary embodiment and/or exemplary method of the present invention.

FIG. 8 shows the gain frequency responses in the control loop of one embodiment of the delta sigma modulator according to the exemplary embodiment and/or exemplary method of the present invention. The frequency is plotted on a logarithmic scale on the x axes of the subfigures in FIG. 8. The top subfigure describes the absolute value of the gain from the input of sensor element 100 in FIG. 5 to its output. The middle subfigure describes the absolute value of the gain from the input of digital filter 510 in FIG. 5 to the output of this digital filter. The bottom subfigure describes the absolute value of the gain from the input of sensor element 100 in FIG. 5 to the output of digital filter 510 in FIG. 5.

The top subfigure in FIG. 8 shows the absolute value of the transmission function of the sensor element (deflection as a function of acceleration). The resonance peak at resonance frequency $f_R$ is shown. The middle subfigure shows the absolute value of the gain response of the electronic bandpass on a logarithmic scale. The bottom subfigure shows the gain response which results when the sensor element and electronic bandpass are connected in series. In the case of the sensor resonance frequency, the combination of both gain responses achieves substantial peaking. In the closed control loop of the electromechanical delta sigma modulator, this high gain is responsible for the fact that the quantization noise of the DAC is substantially suppressed in the range of the sensor resonance frequency at the output of the delta sigma modulator.

The quantization noise of the ADC is suppressed according to the gain of the sensor element illustrated in the top subfigure. This results in a fourth-order electromechanical delta sigma modulator, which includes a second-order mechanical component (the sensor element) and a second-order electronic component (for example, the low pass having a figure of merit peak). This electronic low pass having a figure of merit peak adds additional state memories to the microsystem in which the effect of the DAC quantization error may be stored.

The digital design of the low pass having a figure of merit peak, or the alternate configurations (for example, a bandpass and phase shifter) provides the advantage that problems relating to long-time drift, electromagnetic compatibility (EMC) and temperature dependencies are avoided. Inaccuracies due to process tolerances are also circumvented. Furthermore, the digital filter may be implemented in a manner which minimizes input power loss.

A further object of the exemplary embodiment and/or exemplary method of the present invention is to make the clock frequency of the low pass having a figure of merit peak or the alternate configurations (for example, a bandpass and phase shifter) directly independent of the drive resonance frequency of the sensor element. This provides the advantage that the center frequency of the bandpass is always set precisely to the drive resonance frequency of the sensor element, since it is automatically sensed. This, in turn, ensures an optimum shaping of the DAC quantization noise. The loop gain and therefore the bandwidth of the delta sigma modulator also becomes independent of scatter of the drive resonance frequency of the sensor element.

One advantage of the digital filter according to the exemplary embodiment and/or exemplary met-hod of the present invention is that the phase shift of the low pass having a figure of merit peak or the alternate configuration always equals the planned value in the case of the drive resonance frequency. There is no danger of scatter, for example due to tolerances in the manufacturing process. This ensures the stability of the electromechanical delta sigma modulator.

The exemplary embodiment and/or exemplary method of the present invention is not limited to electromechanical delta sigma modulators, i.e., delta sigma modulators having a mechanical oscillator. Other oscillatory systems are also conceivable as part of the delta sigma modulator according to the exemplary embodiment and/or exemplary method of the present invention.

In addition, other exemplary embodiments are conceivable.

The invention claimed is:

1. A delta sigma modulator comprising:
    an oscillatory system having a natural frequency;
    an electronics arrangement;
    a control loop arrangement to act upon the electronics from the oscillatory system and upon the oscillatory system from the electronics arrangement, wherein a gain in the control loop demonstrates a peaking in a frequency range around the natural frequency of the oscillatory system;
    wherein the electronics arrangement includes at least one of a multibit analog-digital converter and a multibit digital-analog converter.

2. The delta sigma modulator of claim 1, wherein the oscillatory system includes a mechanical arrangement.

3. The delta sigma modulator of claim 1, wherein the delta sigma modulator has a bandpass characteristic at one output.

4. The delta sigma modulator of claim 1, wherein the electronics arrangement includes an analog-digital converter, a digital-analog converter and a setting arrangement to at least one of set a gain in the control loop and a bandwidth of the delta sigma modulator independently of an input signal of the analog-digital converter.

5. The delta sigma modulator of claim 3, wherein the electronics arrangement includes a low pass digital filter having a peak for providing an increase in an amplification factor, so that the delta sigma modulator has a bandpass characteristic having a midband frequency at the natural frequency of the oscillatory system.

6. The delta sigma modulator of claim 3, wherein the electronics arrangement includes a digital bandpass filter and a phase shifter, so that the delta sigma modulator has a bandpass characteristic having a midband frequency at the natural frequency of the oscillatory system.

7. The delta sigma modulator of claim 5, wherein the electronics arrangement includes a phase locked loop arrangement for deriving an oscillation frequency of the oscillatory system to control the midband frequency.

8. The delta sigma modulator of claim 1, wherein the digital-analog converter includes a centered pulse-width-modulated output signal which acts upon the oscillatory system.

* * * * *